(12) United States Patent
Lee et al.

(10) Patent No.: US 12,133,322 B2
(45) Date of Patent: Oct. 29, 2024

(54) ELECTROMAGNETIC INTERFERENCE SHIELDS HAVING ATTENUATION INTERFACES

(71) Applicant: Intel Corporation, Santa Clara, CA (US)

(72) Inventors: Jaejin Lee, Beaverton, OR (US); Isaac Simpson, Beaverton, OR (US); Dong-Ho Han, Beaverton, OR (US); Jose Salazar Delgado, San Jose (CR); Arturo Navarro Alvarez, Belen (CR)

(73) Assignee: Intel Corporation, Santa Clara, CA (US)

( * ) Notice: Subject to any disclaimer, the term of this patent is extended or adjusted under 35 U.S.C. 154(b) by 796 days.

(21) Appl. No.: 17/133,113

(22) Filed: Dec. 23, 2020

(65) Prior Publication Data

US 2021/0120665 A1 Apr. 22, 2021

(51) Int. Cl.
*H05K 1/02* (2006.01)

(52) U.S. Cl.
CPC ......... *H05K 1/0225* (2013.01); *H05K 1/0298* (2013.01); *H05K 2201/093* (2013.01)

(58) Field of Classification Search
CPC .............. H05K 1/0225; H05K 1/0298; H05K 2201/093
USPC ........................................................ 174/260
See application file for complete search history.

(56) References Cited

U.S. PATENT DOCUMENTS

| 6,269,008 | B1 * | 7/2001 | Hsu ...................... H05K 9/0032 361/818 |
| 8,855,788 | B2 * | 10/2014 | Lloyd .................... A61B 5/287 607/116 |
| 10,653,048 | B1 | 5/2020 | Green |
| 2008/0106884 | A1 * | 5/2008 | English ............... H05K 9/0032 361/818 |
| 2016/0234356 | A1 * | 8/2016 | Thomas ................... H04K 3/84 |
| 2020/0329593 | A1 | 10/2020 | Khan |

OTHER PUBLICATIONS

European Patent Office, "European Search Report," issued in connection with Application No. 21 19 8064, dated Mar. 14, 2022, 11 pages.
European Patent Office, "Communication pursuant to Article 94(3) EPC," issued in connection with European Patent Application No. 21 198 064.4-1201, dated Apr. 17, 2024, 9 pages.

* cited by examiner

*Primary Examiner* — Andargie M Aychillhum
(74) *Attorney, Agent, or Firm* — Hanley, Flight & Zimmerman, LLC

(57) ABSTRACT

Electromagnetic interference (EMI) shields having attenuation interfaces are disclosed. A disclosed example EMI shield includes side walls defining sides of the EMI shield, and an attenuation interface to be placed into contact with a circuit board. The attenuation interface includes an inner perimeter having an EMI absorber and an outer perimeter having a metal backing to at least partially surround the EMI absorber.

20 Claims, 11 Drawing Sheets

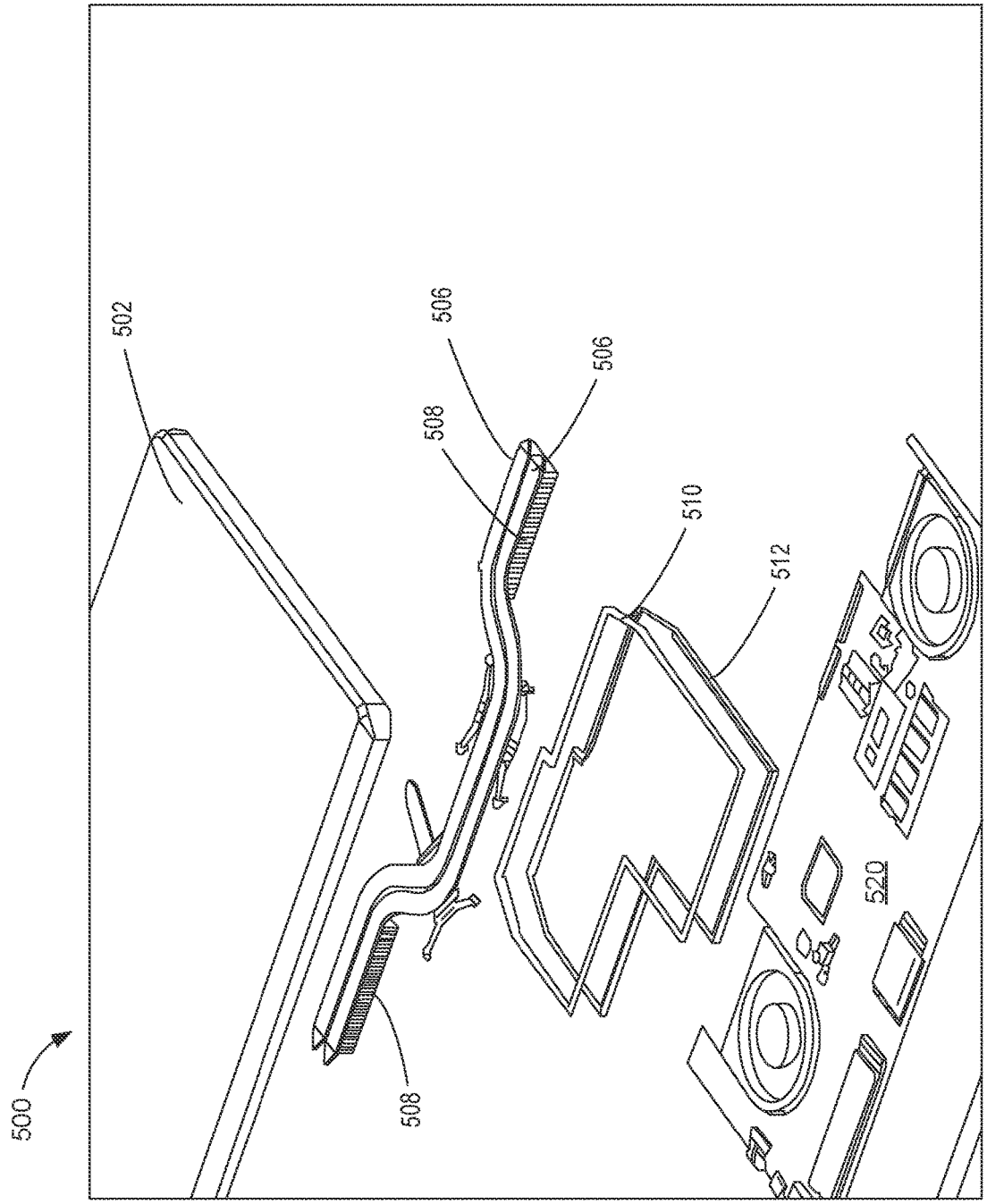

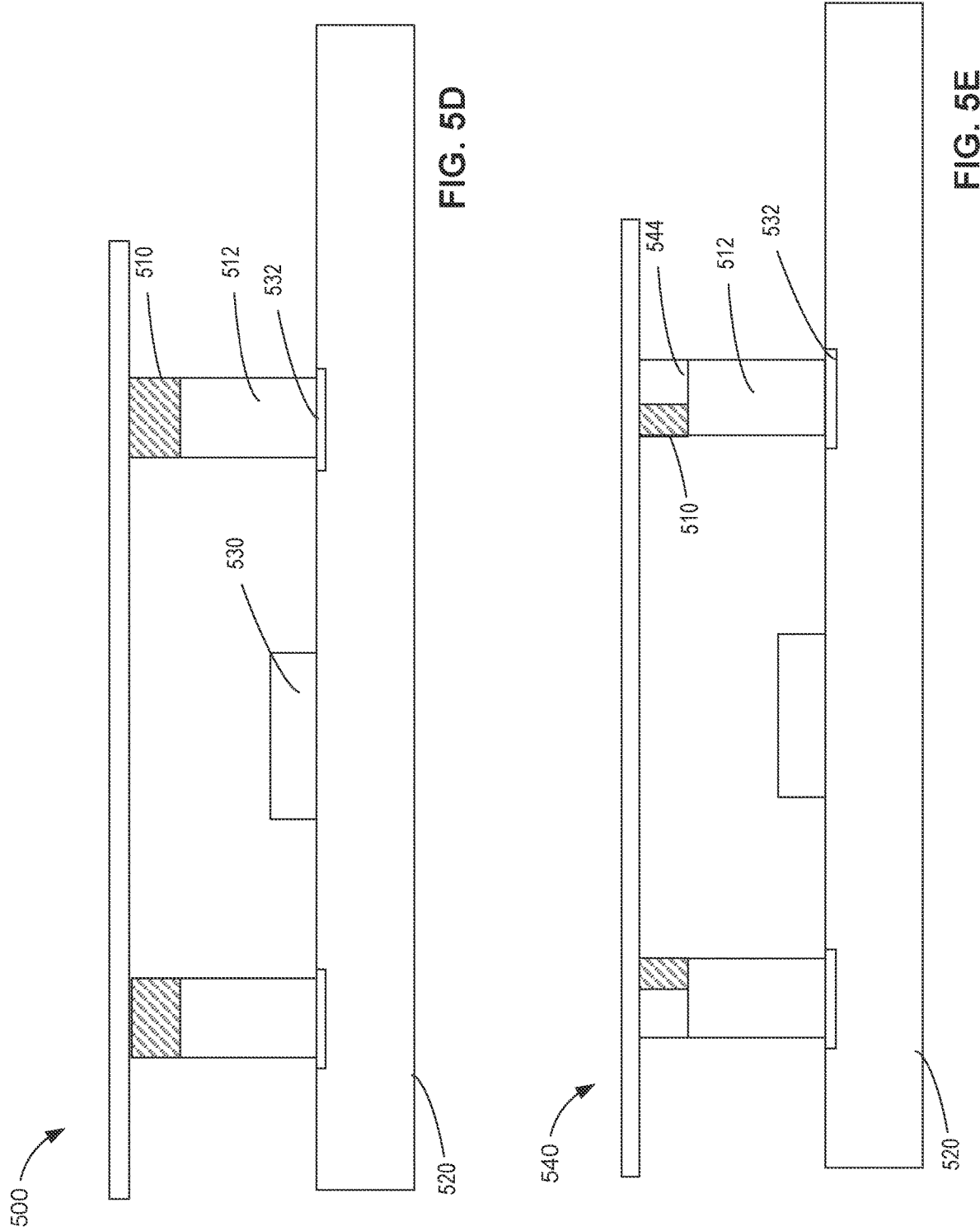

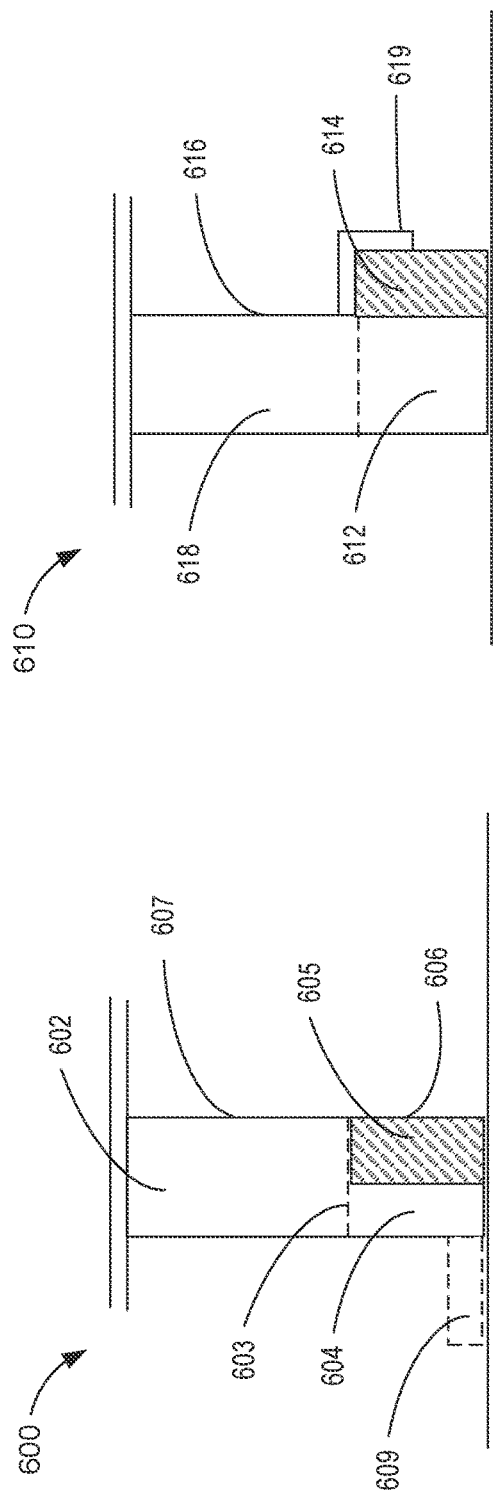
FIG. 6A
FIG. 6B
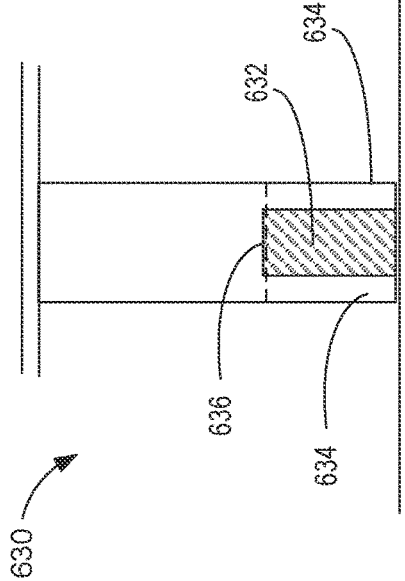
FIG. 6C
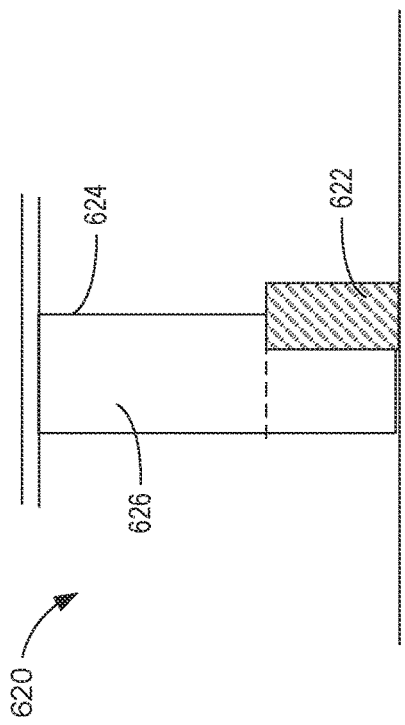
FIG. 6D

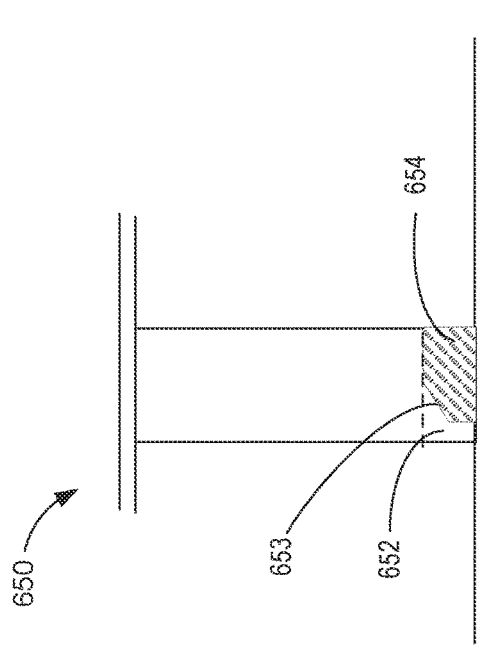
FIG. 6E
FIG. 6F
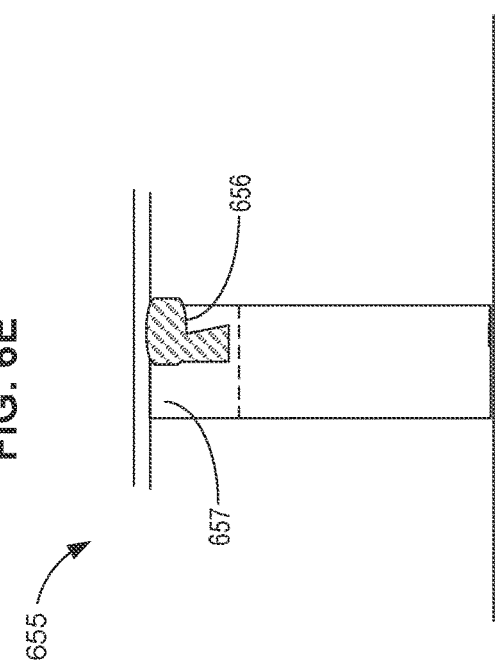
FIG. 6G
FIG. 6H

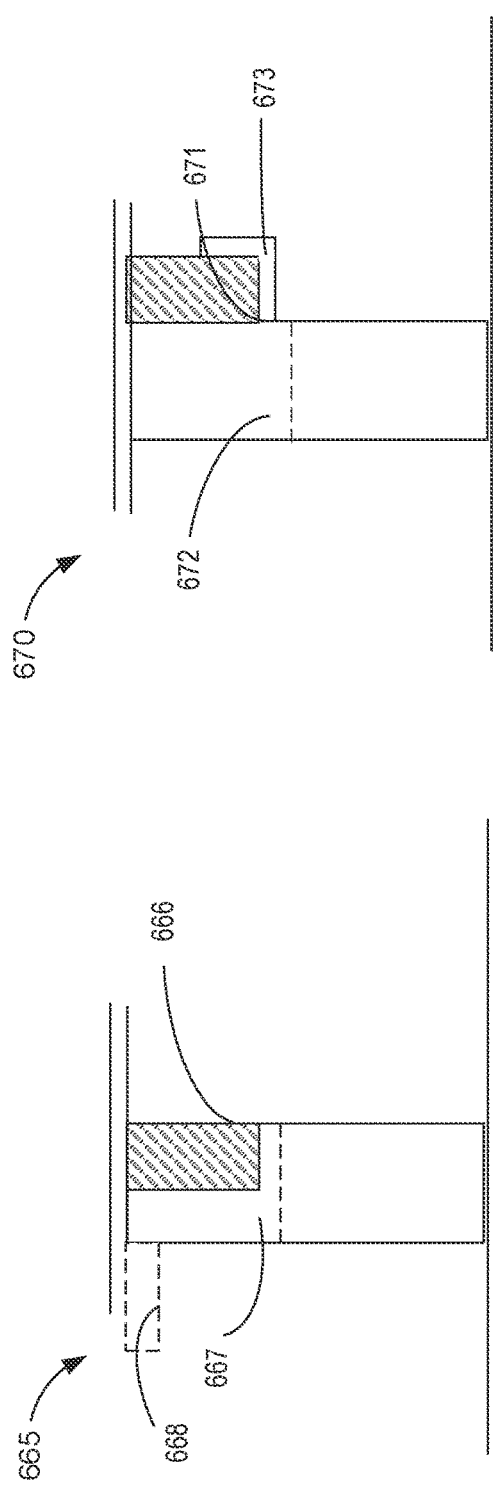
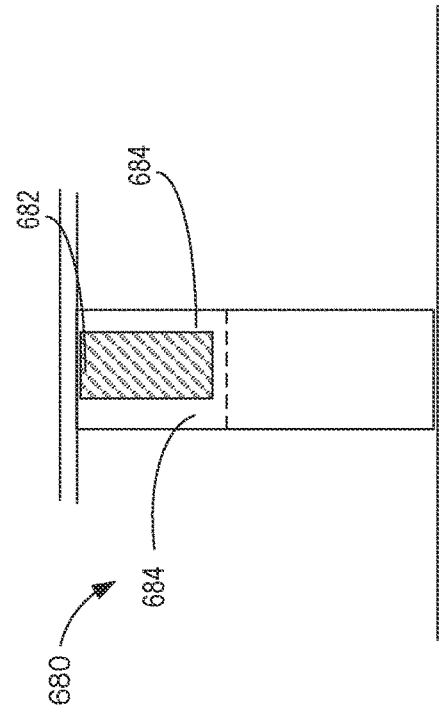
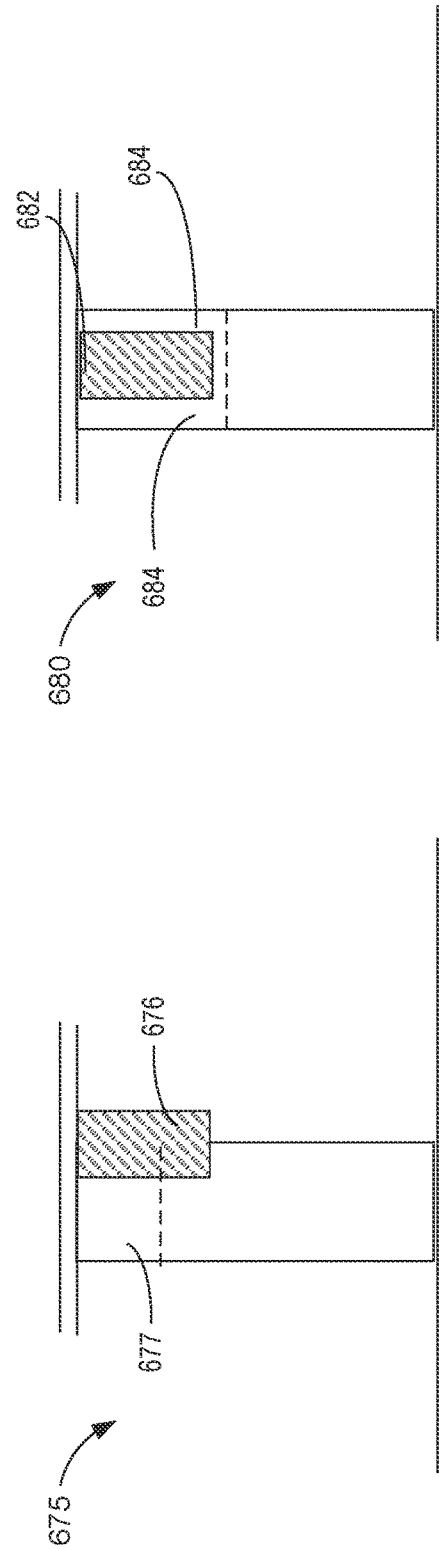

ELECTROMAGNETIC INTERFERENCE SHIELDS HAVING ATTENUATION INTERFACES

FIELD OF THE DISCLOSURE

This disclosure relates generally to shielding and, more particularly, to electromagnetic interference shields having attenuation interfaces.

BACKGROUND

Electromagnetic interference (EMI) can be emitted from electrical components mounted to a printed circuit board (PCB). The EMI can adversely affect operation of other electrical components. For example, a graphics processing unit (GPU) operating on a PCB can emit a significant amount of noise radiation, thereby causing malfunction or diminished performance of other electrical components. To mitigate effects of EMI, some known PCB implementations employ shields or EMI absorber blocks.

BRIEF DESCRIPTION OF THE DRAWINGS

FIGS. 5A-5E depict another example implementation in accordance with examples disclosed herein.

FIGS. 6A-6L are partial cross-sectional views of example attenuation interfaces that can be implemented in examples disclosed herein.

Figure 1:
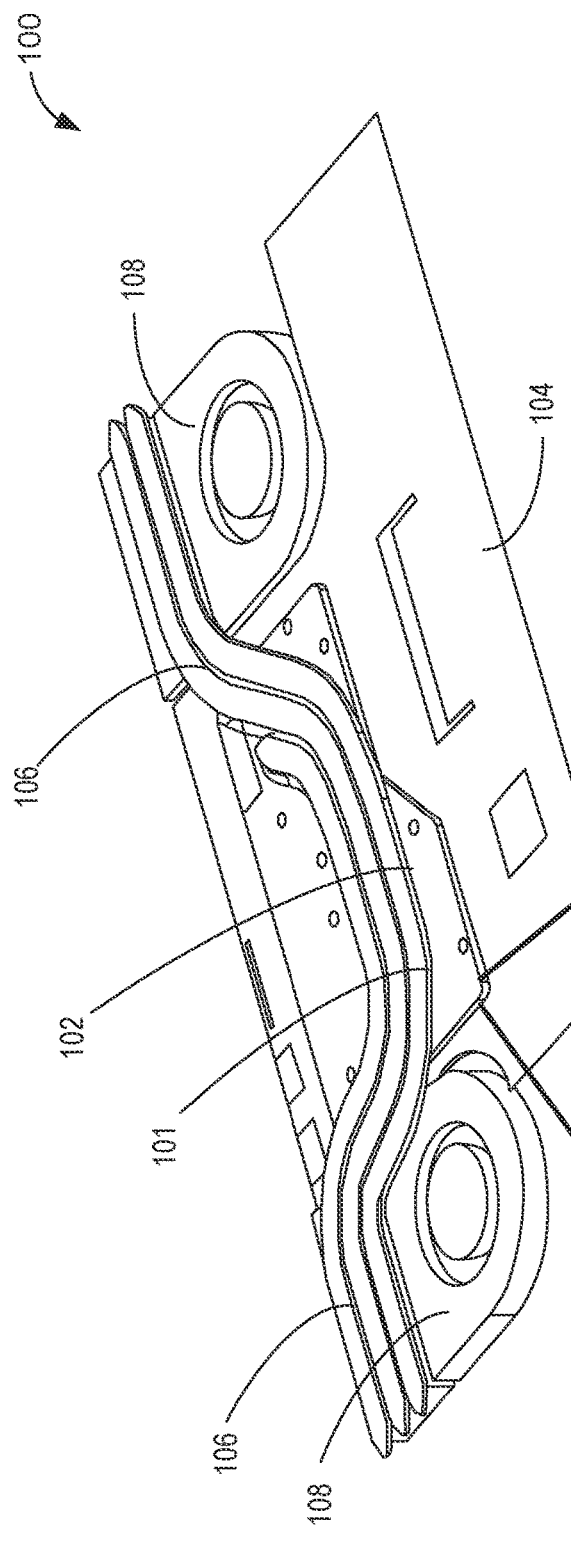
FIG. 1 illustrates portions of an example computing device with an example attenuation interface in accordance with teachings of this disclosure.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, area, or region) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc. are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

Electromagnetic interference (EMI) shields having attenuation interfaces are disclosed. EMI can be emitted from electrical components on printed circuit boards (PCBs) of a computing device and/or a wireless device. As a result of the EMI, operation and/or performance of the computing device and/or the wireless device can be adversely impacted. To mitigate the effects of EMI, some PCBs employ shields or EMI absorbers to reduce undesirable noise radiation. In particular, some known PCBs have a soldered EMI shield that is electrically coupled to a ground plane However, these EMI shields require electrical pads on a corresponding circuit board, and can degrade in performance when portions thereof are displaced and/or moved (e.g., a lid is moved, a gap is introduced, etc.). In addition, placement of fine pitch electrical pads in most high-density PCB can necessitate additional cost or PCB layers to relocate input output (I/O) bus and power planes from a surface layer to inner layers. Other known implementations utilize a significant amount of EMI absorber blocks, gaskets or sheets. However, these known implementations can be costly and occupy a significant amount of space, as well as circuit board surface area, and only operate effectively in a narrow band.

Examples disclosed herein enable relatively low cost and space-saving EMI shields that are highly effective at isolating and reducing EMI by utilizing both absorption and reflection losses. Accordingly, examples disclosed herein can enable increased radio frequency (RF) performance of computing devices and/or wireless devices. Examples disclosed herein can also enable space saving circuit boards by facilitating relatively dense circuit board routing. Further, by mitigating EMI, examples disclosed herein enable increased compactness of computing devices by enabling closer placement of components and/or devices. Examples disclosed herein do not require electrical contact to ground like typical EMI shields and, thus, do not necessitate electrical or ground contacts on a PCB, thereby saving space and reducing complexity of the PCB.

Examples disclosed herein implement an EMI shield with a portion or section to contact and/or to be coupled to a circuit board, such as a PCB (e.g. a rigid PCB, a flexible PCB, etc.). Particularly, examples disclosed herein utilize an attenuation interface (e.g., an attenuation interface portion, an attenuation contact portion, an attenuation wall, an attenuation border, etc.) that includes an inner wall or perimeter having an EMI absorber (e.g., an EMI absorption material, an EMI gasket, etc.). The attenuation interface also includes an outer wall or perimeter that at least partially surrounds (e.g., fully surrounds) the inner wall or perimeter. The outer wall or perimeter is at least partially composed of metal, thereby defining a metal backing of the EMI absorber. Examples disclosed herein can be placed onto a circuit board without being electrically coupled to (e.g., coupled to a ground plane) of the circuit board. In some examples, the attenuation interface is coupled to (e.g., mechanically coupled to) or placed against (e.g., compressed against) the circuit board. As a result, the attenuation interface can effectively increase EMI noise suppression.

In some examples, the attenuation interface and/or the outer perimeter is integral with the EMI shield. Additionally or alternatively, the outer perimeter is part of and/or unitary with a side wall (e.g., a lateral wall) of the EMI shield. In some examples, the EMI absorber is compressible against the circuit board and/or a chassis. In some examples, the EMI absorber at least partially covers a roof or top wall of the EMI shield. In some examples, the outer perimeter and the inner perimeter extend along a side wall of the EMI shield (e.g., extend along an entire height of the EMI shield). In some such examples, the outer perimeter and the inner perimeter define an opening of a top surface of the EMI shield (e.g., a top surface of the EMI shield defines an opening). The opening can be placed into contact with a chassis or housing of the computing device. For example, the housing or chassis can also operate as EMI shielding when compressed or biased toward the opening by defining a relatively closed volume with the inner and outer perimeters.

As used herein, the term "shield" refers to a device, component and/or assembly implemented to cover or shield electrical and/or computing devices at least partially disposed within. As used herein, the terms "interface" and "interface portion" refer to a portion of a body, structure and/or shield that is brought into contact and/or in proximity with an electrical board. Accordingly, the terms "interface" and "interface portion" can refer to a contacting portion of the body, structure and/or shield. As used herein, the term "EMI absorber" refers to a material, device, component and/or assembly used to reduce and/or absorb emissions. Accordingly, the term "EMI absorber" refers to conductive or non-conductive materials providing conductive, dielectric and/or magnetic absorption or losses.

FIG. 1 illustrates portions of an example computing device (e.g., a portable computer, a tablet, a mobile phone, etc.) 100 with an example attenuation interface 101 in accordance with teachings of this disclosure. In the illustrated example of FIG. 1, an example EMI shield (e.g., an EMI cage load frame) 102 is shown mounted onto and/or coupled to a circuit board (e.g., a PCB, a flexible circuit board, a rigid PCB, etc.) 104. Further, in this example, heat pipes 106 are thermally and mechanically coupled to the EMI shield 102 and/or components positioned within the EMI shield 102. In turn, coolers (e.g., fan coolers, a blower coolers, etc.) 108 are mechanically and thermally coupled to the heat pipes 106.

According to examples disclosed herein, in operation, the EMI shield 102 of the illustrated example is placed into contact with the circuit board 104 at the attenuation interface 101. In particular, the EMI shield 102 is supported by the circuit board 104 and positioned to cover (e.g., house, at least partially surround, etc.) numerous electrical components mounted onto the circuit board 104. The components can include a processor or a graphics processing unit (GPU), for example. In this example, the EMI shield 102 defines the attenuation interface 101 with the circuit board 104 to reduce and/or mitigate undesired emission of EMI signals and/or radiation of components of the circuit board 104. In this example, some components of the circuit board 104 are not covered by the EMI shield 102. In other examples, the EMI shield 102 may cover all components of a side of the circuit board 104. In this example, the EMI shield 102 includes an aperture to facilitate positioning of the heat pipes 106 and cooling of the components within the EMI shield 102. In particular, a thermal routing interface contacting the heat pipes 106 extends to an interior of the EMI shield 102 to be thermally coupled to the components located within the EMI shield 102.

To facilitate heat transfer and define an effective thermal pathway from (e.g., draw heat away from) the components of the circuit board 104 to the coolers 108, the heat pipes 106 draw heat and/or thermal energy away from the components of the circuit board 104. In the illustrated example, the EMI shield 102 acts as a support and thermal cooling pathway for the heat pipes 106, thereby enabling efficient routing and/or placement of the heat pipes 106 within the computing device 100. Additionally or alternatively, the EMI shield provides a downward force (e.g., a downward compression force) using a back-plate positioned on an opposite side of the circuit board 104. In other words, the EMI shield 102 can act as a load cage or a load frame. In some examples, a cold plate (e.g., a copper cold plate) is assembled to the EMI shield 102 and/or a component of the circuit board 104, such as a central processing unit (CPU) or graphics processing unit (GPU). In turn, the cold plate can be thermally coupled to the EMI shield 102 and/or the heat pipes 106.

Figure 2:
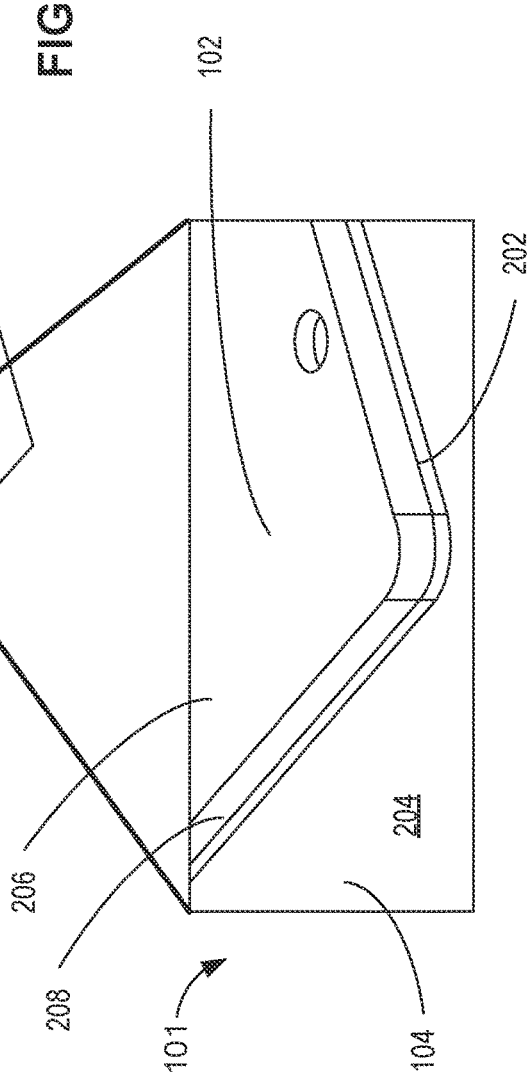
FIG. 2 is a detailed view of the example attenuation interface of FIG. 1

FIG. 2 is a detailed view of the attenuation interface 101 of FIG. 1. In the illustrated example, a contacting portion 202 of the EMI shield 102 is shown placed onto a surface 204 of the circuit board 104. In the illustrated example, the EMI shield 102 includes an upper wall (e.g., a roof, a ceiling, a top surface, a top edge, etc.) 206 and side walls (e.g., lateral walls, etc.) 208. In particular, the upper wall 206 rigidly supports the side walls 208, thereby defining a cage-like partially enclosed structure of the EMI shield 102.

Figure 3B:
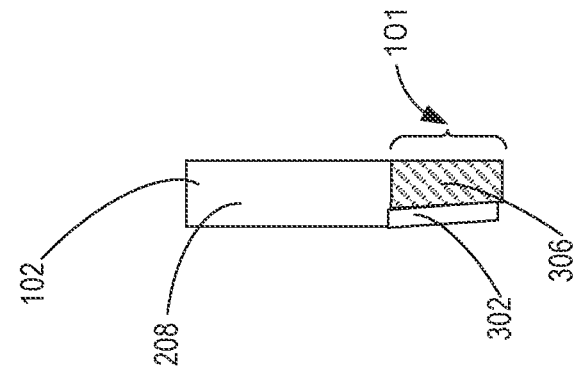
FIGS. 3A and 3B are detailed views of the example attenuation interface of FIGS. 1 and 2.
Figure 3A:
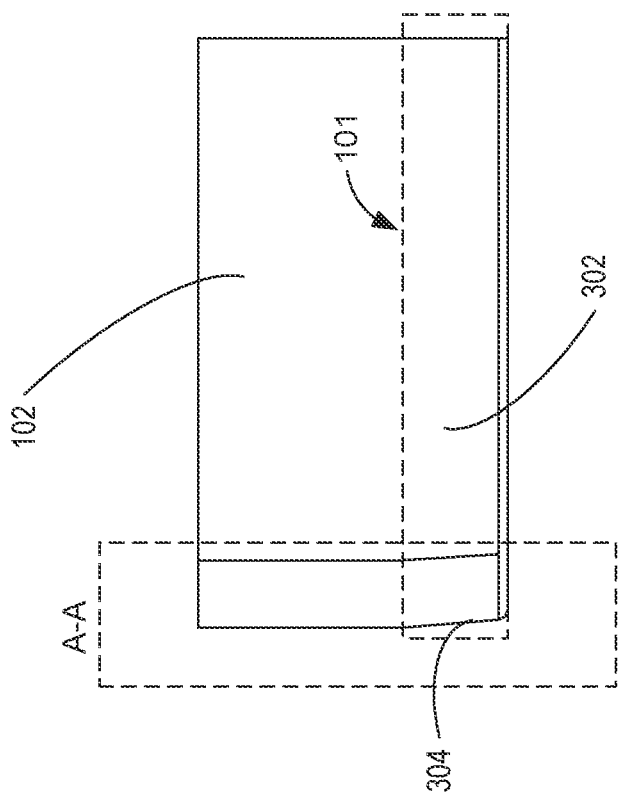

FIGS. 3A and 3B are detailed views of the example attenuation interface 101 of FIGS. 1 and 2. Turning to FIG. 3A, a side view of the EMI shield 102 is shown. In the illustrated example of FIG. 3A, the attenuation interface 101 is implemented as an outer perimeter (e.g., an outer wall, an outer ring, etc.) 302, which includes and/or is composed of a metal backing that exhibits a taper 304. In this example, the outer perimeter 302 extends across an entire perimeter of the EMI shield 102. In other words, the attenuation interface 101 surrounds and follows an entire footprint of the EMI shield 102.

FIG. 3B is a partial cross-sectional view of the example attenuation interface 101 along a plane A-A shown in FIG.

3A. In the illustrated example of FIG. 3B, the side wall 208 in conjunction with the attenuation interface 101 defines a significantly closed inner volume and/or chamber of the EMI shield 102. Further, the side wall 208 is shown supporting the outer perimeter 302, which is at least partially composed of metal, and an inner perimeter 306, which is at least partially composed of an EMI absorber (e.g., an EMI absorber material, an EMI absorption gasket, etc.). The example outer perimeter 302 is implemented as a metal backing and surrounds the inner perimeter 306 and extends along an entire periphery of the EMI shield 102. In this example, the EMI shield 102 is not electrically coupled to (e.g., coupled to a ground plane) of the circuit board 104. In other words, the EMI shield 102 is electrically isolated from the circuit board 104, for example.

In some examples, the outer perimeter 302 and the inner perimeter 306 define and/or are integral with the side walls 208. In examples where the outer perimeter 302 and the inner perimeter 306 define an entirety of the side walls 208, the outer perimeter 302 and the inner perimeter 306 can define an opening at a top surface of the EMI shield 102 that is positioned on an opposite end of EMI shield 102 from that of the circuit board 104. In some examples, only the outer perimeter 302 is integral with the side wall 208. In some such examples, the outer perimeter 302 is cast and/or defined onto the side wall 208. Additionally or alternatively, the side wall 208 is machined from the side wall 208 to define the outer perimeter 302.

In some examples, the outer perimeter 302 and the inner perimeter 306 are manufactured as a single piece separating from the side wall 208 by a cast or dispense process. Accordingly, the attenuation interface 101 may sit on the circuit board 104 and can coupled with the side walls 208 when the EMI shield 102 is loaded with a downward compression force.

In some examples, the outer perimeter 302 can be implemented as a dispensable conductive form and the inner perimeter 306 can be a dispensable absorbing material, respectively. In some examples, the outer perimeter 302 and the inner perimeter 306 can be dispensed directly onto the bottom of the side wall 208 and, subsequently, be cured.

In other examples, the outer perimeter 302 is coupled to the side wall 208. In particular, the outer perimeter 302 can be shaped as a ring or outer perimeter (e.g., a removable and/or replaceable ring or outer perimeter, a shield fence) that is contoured and/or shaped to match the footprint of the EMI shield 102. In some examples, the inner perimeter 306 is implemented as a gasket (e.g., a compressible gasket, etc.). In particular, the inner perimeter 306 can be implemented as a compressible elastomer with embedded metal flakes. However, any appropriate structure or material of the inner perimeter 306 can be implemented instead. Additionally or alternatively, the inner perimeter 306 is removably couplable, removable and/or replaceable from the side wall 208 and/or the outer perimeter 302.

In some examples, the inner perimeter 306 is at least partially compressible against the circuit board 104. In some such examples, the inner perimeter 306 extends past the outer perimeter 302 when the inner perimeter 306 is in an uncompressed and/or relaxed state. In some examples, the EMI shield 102 and/or the outer perimeter 302 is at least partially coupled to (e.g., soldered to, attached to, removably coupled to, adhered to, mechanically coupled via a snap fit, etc.) the circuit board 104. Additionally or alternatively, a distal end of the outer perimeter 302 contacts and or is coupled to (e.g., mechanically coupled but not electrically coupled) the circuit board 104. In some examples, a ratio of a width of the inner perimeter 306 to the outer perimeter 302 is approximately 0.90 to 1.30 (e.g., 1.10). In this example, the EMI shield is not grounded to the circuit board 104 because the example EMI shield 102 does not necessitate grounding to be effective. However, in some other examples, the EMI shield 102 can be electrically coupled and/or grounded to the circuit board 104.

Figure 4A:
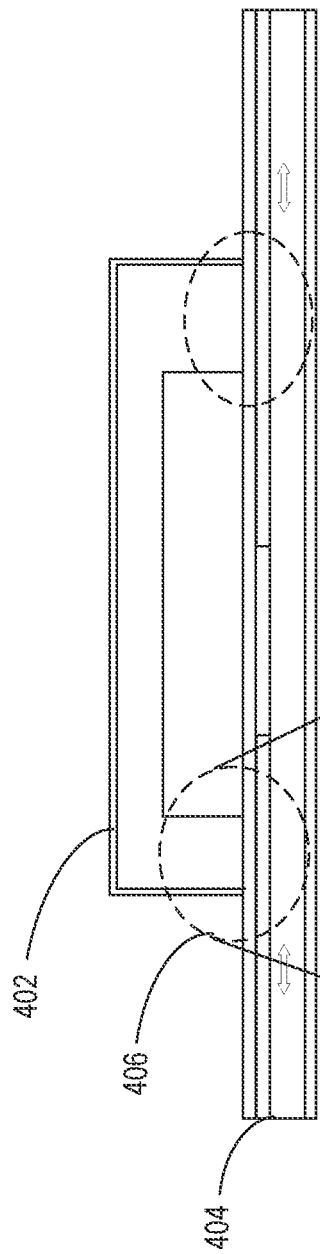
FIGS. 4A and 4B are cross-sectional views of an example implementation in accordance with examples disclosed herein.
Figure 4B:
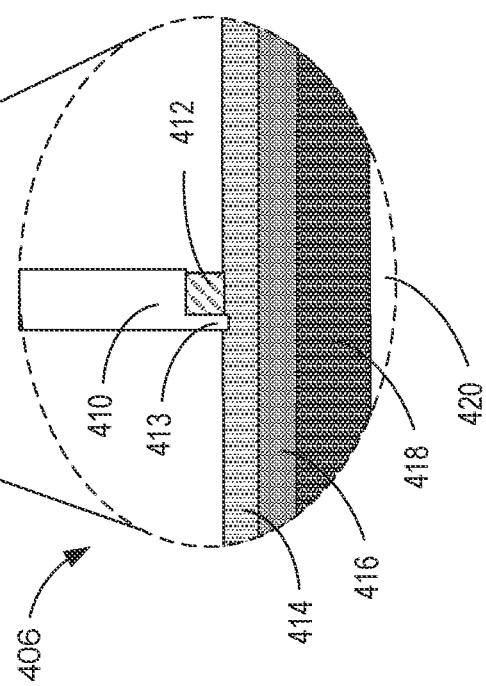

FIGS. 4A and 4B are cross-sectional views of an example implementation in accordance with teachings of this disclosure. Turning to FIG. 4A, an EMI shield 402 is shown mounted and/or coupled to a circuit board 404 at an attenuation interface 406. In this example, the circuit board 404 is fabricated with multiple layers including routing and structures (e.g., routing layers, vias, ground layers, etc.).

FIG. 4B is a detail of the cross-sectional view shown in FIG. 4A. In the illustrated example, the attenuation interface 406 of the EMI shield 402 extends from a wall 410 and is shown having an inner perimeter 412 at least partially composed of an EMI absorber. The example attenuation interface 406 also includes an outer perimeter 413, which is at least partially composed of metal, surrounding the inner perimeter 412. In this example, the attenuation interface 406 is in contact with a solder mask layer 414. However, the EMI shield 402 is not electrically coupled to the circuit board 404. Further, an input/output (I/O) layer 416 is adjacent the solder mask layer 414. In turn, the I/O layer 416 is adjacent and coupled to a substrate layer 418. In this example, the substrate layer 418 is coupled, positioned proximate to and/or adjacent to a ground layer or plane(s) 420. In contrast, for known EMI shields, the I/O layer 416 would not be defined on the surface. In particular, the I/O breakouts for known EMI shields, especially the region in proximity to the CPU and GPU, require high-density I/O bus routings, thereby necessitating that the 10 layer 416 be relocated to inner layers to free space for ground pads associated with the EMI shield 402. In other words, the use of the known EMI shield will increase the circuit board 404 layer count and cost.

While the example circuit board 404 is shown with the layers 414, 416, 418, 420, any appropriate board construction can be implemented instead. In the illustrated example, placement of the EMI shield 402 over the solder mask layer 414 in combination with the attenuation interface 406 reduces an amount EMI emitted. For example, components such as silicon on chips (SOCs), dynamic random access memory (DRAM), power components, etc. that emit significant amounts of interference or noise can be operated without significant negative impacts to other components of the circuit board 404 and/or other electronics of a respective computing device. Further, EMI can be prevented from entering and/or being emitted to layers of the circuit board 404. Due to the EMI noise reduction and/or prevention, device spacing and/or component routing of the circuit board 404 can be spaced at a relatively close distance (e.g., relatively high density routing), thereby enabling computing devices that are relatively compact.

FIGS. 5A-5E depict another example implementation in accordance with teachings of this disclosure. In particular, the examples of FIGS. 5A-5E represent example attenuation interfaces with discrete and separable perimeters (e.g., upper and lower perimeter portions, discrete perimeter rings, separate outer sections, etc.) defining an EMI shield with a top opening to be covered by a separate upper wall (e.g., a ceiling, a roof, etc.). Particularly, in this example, the top surface is enclosed and/or shielded by another component (e.g., a housing, a chassis, a wall, a plate, etc.). In the illustrated example of FIG. 5A, an exploded view of a computing device assembly 500 is shown. The example computing device assembly 500 includes a housing (e.g., an outer housing, a chamber, a fabricated housing, a cover, an outer chassis, an inner chassis, a plate, a frame, etc.) 502, heat pipes 506, and heat sinks (e.g., heat sink arrays) 508, The example computing device assembly 500 also includes an edge gasket 510, which is at least partially composed of an EMI absorber (e.g., an EMI absorbing gasket), and a shield fence (e.g., a metal backing, etc.) 512, which is at least partially composed of metal (e.g., a metal frame, an outer metal ring, a metal backing, etc.). The metal may be composed of steel, aluminum, or an alloy, for example. In this example, the edge gasket 510 and the shield fence 512 longitudinally extend between the housing 502 and a circuit board 520. In this example, the edge gasket 510 contacts housing 502 while the shield fence 512 contacts the circuit board 520. Further, in some examples, the shield fence 512 is placed outside of and/or away from higher-density routing areas for desirable contact to electrical contacts (e.g., solder to ground pads) of the circuit board 520.

To define an attenuation interface to reduce EMI emitted from electrical components mounted to the circuit board 520, the edge gasket 510, which includes the aforementioned EMI absorber, is placed within an inner surface of the shield fence 512. In other words, the example edge gasket 510 is positioned inward from the shield fence 512. As mentioned above, the edge gasket 510 and the shield fence 512 extend between the circuit board 520 and the housing 502. In some examples, the housing 502 includes, but is not limited to, a metal coating, a graphite sheet, copper tape, etc. In some examples, the edge gasket 510 is compressed between the housing 502 and the shield fence 512.

Figure 5B:
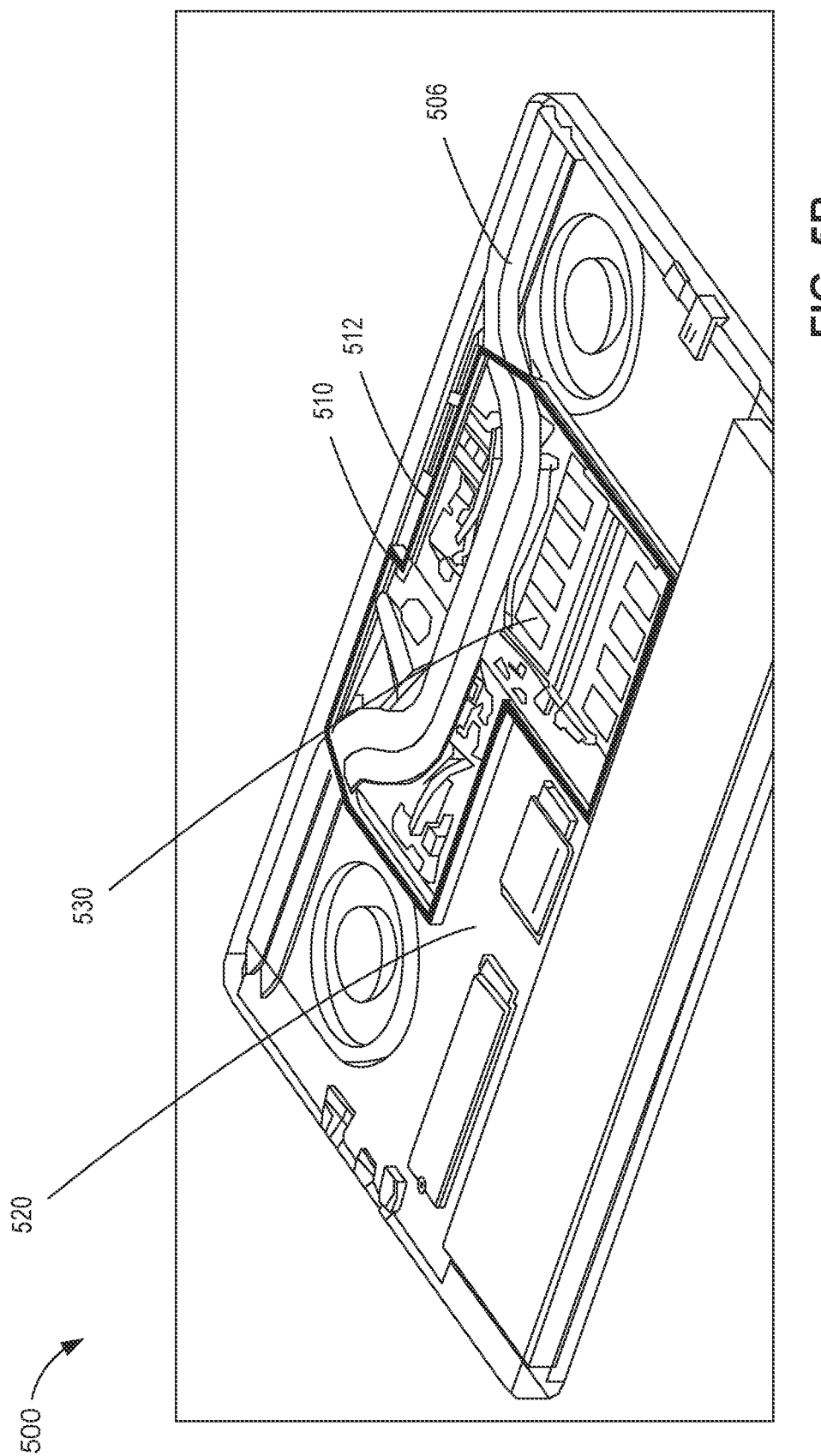

FIG. 5B depicts the example assembly 500 shown in FIG. 5A, but in an assembled state. As can be seen in the illustrated example of FIG. 5B, the aforementioned edge gasket 510 is positioned above the shield fence 512 (in the view of FIG. 5B). In this example, the edge gasket 510 and the shield fence 512 encompass and/or surround numerous EMI generating components 530 mounted to the circuit board 520. Further, the heat pipes 506 are shown disposed within an inner volume defined by the housing 502 (removed for clarity in FIG. 5B), the edge gasket 510 and the shield fence 512. In this examples, the heat pipes 506 are coupled to (e.g., thermally coupled to) at least one of the components 530. Further, the example heat pipes 506 extend through at least one opening of the shield fence 512 to facilitate conducting heat away from the components 530.

Figure 5C:
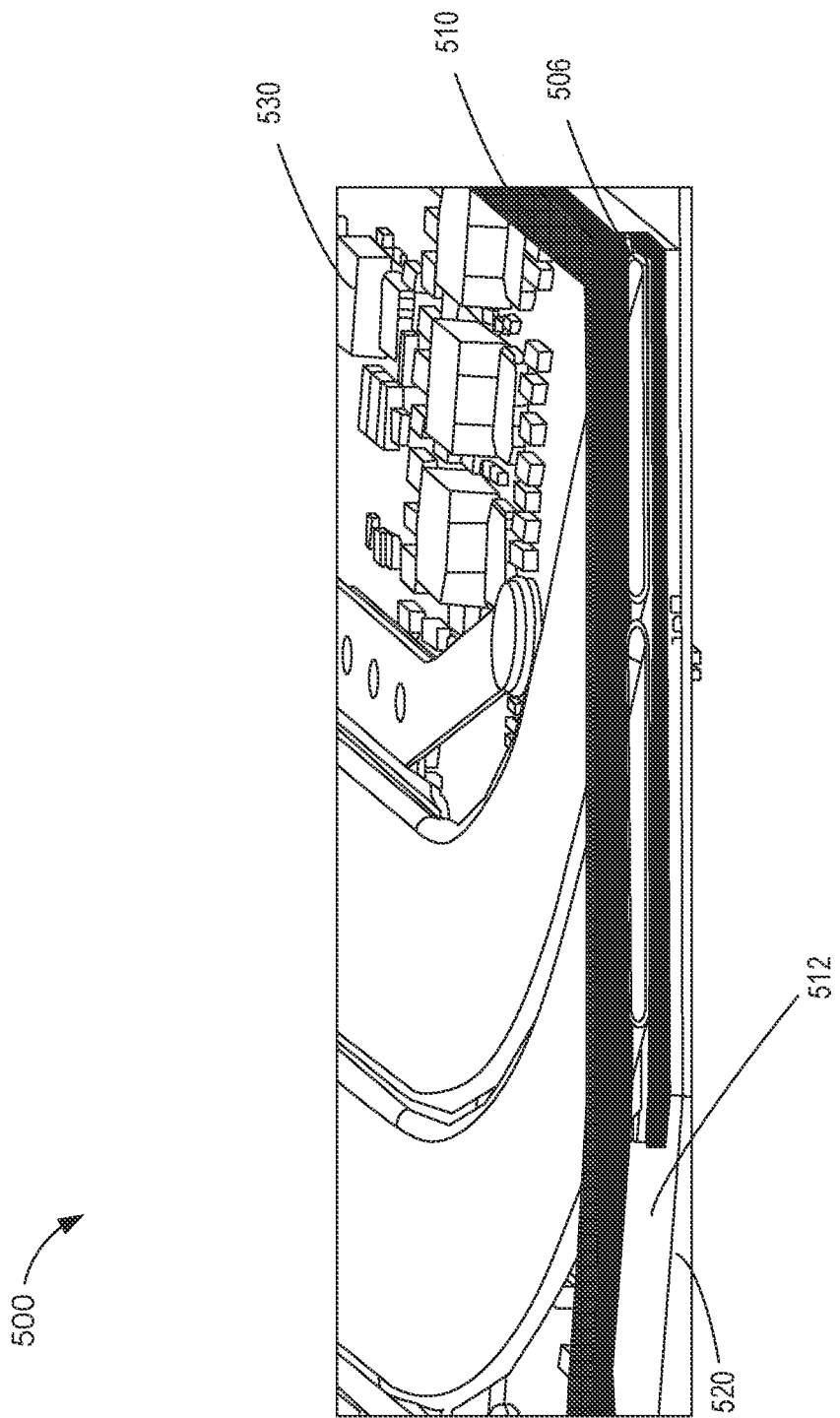

Turning to FIG. 5C, the heat pipe 506 is shown extending from an opening of the shield fence 512, which is adjacent the circuit board 520, and thermally coupled to at least some of the components 530. As can be seen in the illustrated view of FIG. 5C, the edge gasket 510 contacts an edge or surface(s) of the heat pipes 506. In some examples, the heat pipes 506 are at least partially surrounded by the edge gasket(s) 510 at top and bottom surfaces thereof.

FIG. 5D is a cross-sectional view of the example assembly 500. In the illustrated view, the edge gasket 510 is shown positioned between the housing 502 and the shield fence 512, thereby defining an enclosure covering the components 530. In some examples, the shield fence 512 is soldered to the circuit board 520 at an electrical interface (e.g., an electrical contact) 532.

FIG. 5E is a cross-sectional view of an example assembly 540 that is similar to the example assembly 500, but includes a metal backing 544 mounted to an outer surface of the edge gasket 510. As mentioned above, the shield fence 512 may be electrically coupled to the circuit board 520 at the electrical interface 532.

FIGS. 6A-6L are partial cross-sectional views of example attenuation interfaces 600, 610, 620, 630, 640, 650, 655, 660, 665, 670, 675, 680, respectively, that can be implemented in examples disclosed herein. Turning to FIG. 6A, the aforementioned example attenuation interface 600 is shown with a side wall 602 operatively coupled to an outer perimeter 604 that surrounds an inner perimeter 605, which is at least partially composed of an EMI absorber. In some examples, the outer perimeter 604 is integral with the side wall 602 and, alternatively, the outer perimeter 604 is separate from the side wall 602, as generally indicated by a dotted line 603. In this example, an inner surface 606 of the inner perimeter 605 is generally aligned (e.g., flush) to an inner surface 607 of the side wall 602. Additionally or alternatively, a flange (e.g., a mounting flange, an alignment flange, etc.) 609 extends from the outer perimeter 604. The flange 609 can be implemented to couple and/or secure the side wall 602 to a circuit board, for example. Additionally or alternatively, the flange 609 can be implemented to compress the inner perimeter 605 when the flange 609 is coupled to the circuit board. In some examples, the flange 609 is bent from the outer perimeter 604 (e.g. during a sheet metal bending operation).

FIG. 6B depicts the example attenuation interface 610 with an outer perimeter 612 surrounding an inner perimeter 614 that is at least partially composed of an EMI absorber. In this example, the inner perimeter 614 extends past an inner surface 616 of a side wall 618. In some examples, an inner flange 619 is implemented to align, retain and/or position the inner perimeter 614.

FIG. 6C depicts the example attenuation interface 620 that is similar to the example shown in FIG. 6B, but with an inner perimeter 622 partially extending past an inner surface 624 of a side wall 626, but also extending to an inner depth of the side wall 626.

FIG. 6D depicts the example attenuation interface 630. In the illustrated example, an EMI absorber 632 is surrounded by walls 634, which are at least partially composed of metal. In some such examples, the EMI absorber 632 fits into (e.g., is placed into) a recess (e.g., a complementary shaped recess) 636 of a shield and/or housing.

Turning to FIG. 6E, the example attenuation interface 640 is shown. In this example, an outer perimeter 642 surrounds an inner perimeter 644 having an EMI absorber. The example inner perimeter 644 exhibits a generally dovetail-shaped and/or irregular cross-sectional profile 646 to be received by a complementarily shaped recess 647 of the outer perimeter 642. In the illustrated example, the dovetail-shaped cross-sectional profile 646 includes a first portion 648 that is smaller than a second portion 649.

FIG. 6F depicts the example attenuation interface 650. In this example, an outer perimeter 652 at least partially composed of metal surrounds an inner perimeter 654, which an includes an EMI absorber. In this example, the inner perimeter 654 includes at least one chamfer 653.

FIGS. 6G-6L depict the example attenuation interfaces 655, 660, 665, 670, 675, 680, that are located proximate openings of an EMI shield. FIG. 6A depicts the example attenuation interface 655 having a dovetail-shaped inner perimeter 656, which includes an EMI absorber, surrounded by an outer perimeter and/or shield fence 657.

FIG. 6H depicts the example attenuation interface 660 with a chamfered inner perimeter 661 surrounded by an outer perimeter 662.

Turning to FIG. 6I, the example attenuation interface 665 is depicted with an inner perimeter 667 surrounded by an outer perimeter 667. In some examples, flange 668 is implemented to attach to another component, such as a chassis or housing, for example.

FIG. 6J depicts the example attenuation interface 670 with an inner perimeter 671 surrounded by an outer perimeter 672. In the illustrated example, a flange 673 positions and/or compresses the inner perimeter 671 against another component.

Turning to FIG. 6K, the example attenuation interface 675 is depicted with an inner perimeter 676 surrounded by an outer perimeter 677.

The example of FIG. 6L depicts an example attenuation interface 680. In this example, an EMI absorber 682 is surrounded by and/or embedded within walls 684.

None of the features shown in conjunction with the examples of FIGS. 1-6L are limiting. Thus, any of the features of the examples shown in FIGS. 1-6L can be combined with any other feature(s).

Figure 7:
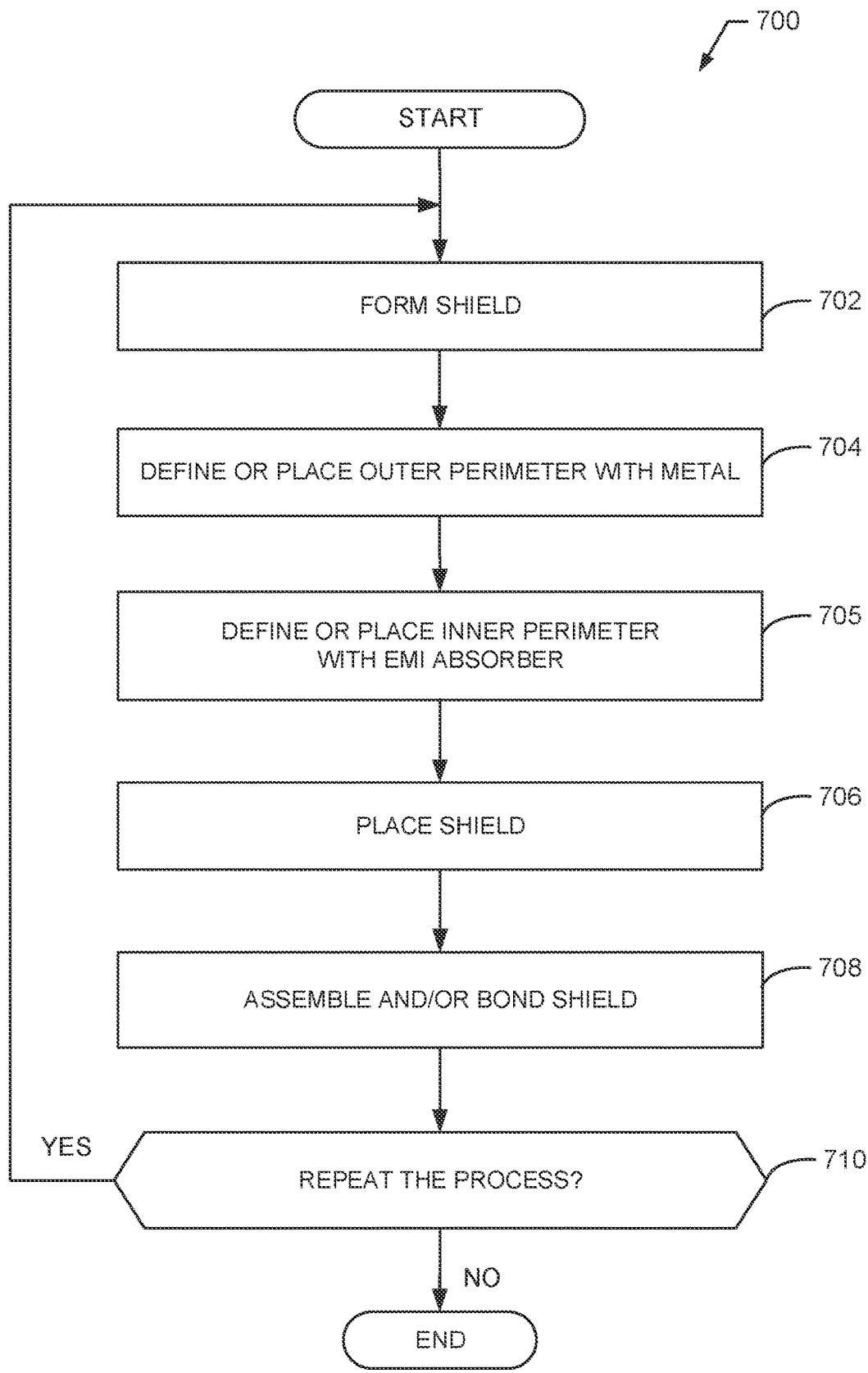
FIG. 7 is a flowchart representative of an example method to produce and/or assemble examples disclosed herein.

FIG. 7 is a flowchart representative of an example method 700 to produce and/or assemble examples disclosed herein. The example method 700 begins as an EMI shield (e.g., the EMI shield 102) is being assembled and placed onto a circuit board (e.g., the circuit board 104) with an attenuation interface (e.g., the attenuation interface 101) being positioned therebetween. In this example, the circuit board is part of a computing device (e.g., the computing device 100).

At block 702, the shield is formed. The shield may be fabricated and/or cast (e.g., die cast). In some other examples, the shield is molded.

At block 704, an outer perimeter, which is at least partially composed of metal, is defined or placed on the shield. In this example, the outer perimeter is assembled to or defined on a portion of the shield to be coupled to a circuit board. Alternatively, the outer perimeter is machined or cut from a side wall of the shield. Additionally or alternatively, the outer perimeter is integral with a side wall of the shield.

At block 705, an inner perimeter having an EMI absorber (e.g., an EMI absorber material, an EMI ring, an EMI gasket) is defined or placed inward from the outer perimeter (e.g., an inner surface or recess of the outer perimeter). In this example, the EMI absorber is assembled to the outer perimeter. In other examples, the EMI absorber is molded onto the outer perimeter. In some other examples, at least a portion of the outer perimeter is coated with the EMI absorber.

In the illustrated example, at block 706, the shield is placed onto the circuit board. In some examples, the shield is aligned to physical (e.g., guide features such as pins or holes) or visual features (e.g., a visual target) of the circuit board. In some other examples, the shield is placed onto the inner perimeter, which may be aligned and coupled to the circuit board.

At block 708, in some examples, the shield is bonded, mechanically coupled and/or assembled to the circuit board. For example, the shield can be coupled to the circuit board at the aforementioned interface portion. In particular, the outer perimeter (e.g., a flange or snap feature of the outer perimeter) can be coupled to the circuit board. In this example, because the shield is not soldered to the circuit board, the shield does not to withstand a thermal reflow process.

At block 710, it is then determined whether to repeat the process. If the process is to be repeated (block 710), control of the process returns to block 702. Otherwise, the process ends. In some examples, the determination is based on whether additional shields are to be placed onto the circuit board. In some examples, the determination is based on whether the placed shield has a sufficient EMI and/or noise reduction (e.g., via production testing).

Example 1 includes an electromagnetic interference (EMI) shield including side walls defining sides of the EMI shield, and an attenuation interface to be placed into contact with a circuit board. The attenuation interface includes an inner perimeter having an EMI absorber, and an outer perimeter having a metal backing to at least partially surround the EMI absorber.

Example 2 includes the EMI shield as defined in example 1, wherein at least one of the outer perimeter or the side walls includes at least one recess to receive the inner perimeter.

Example 3 includes the EMI shield as defined in any of examples 1 or 2, wherein the metal backing is a shield fence to be coupled to the side walls.

Example 4 includes the EMI shield as defined in any of examples 1 to 3, wherein the EMI absorber includes a compressible elastomer with embedded metal flakes.

Example 5 includes the EMI shield as defined in an of examples 1 to 4, wherein the EMI shield is electrically isolated from the circuit board.

Example 6 includes the EMI shield as defined in any of examples 1 to 5, wherein the outer perimeter includes a flange or snap to couple the outer perimeter to the side walls or the circuit board.

Example 7 includes the EMI shield as defined in any of examples 1 to 6, wherein the outer perimeter is integral with the side walls.

Example 8 includes the EMI shield as defined in example 7, wherein the outer and inner perimeters extend to a top surface of the EMI shield.

Example 9 includes the EMI shield as defined in example 8, wherein the outer and inner perimeters define an opening at the top surface of the EMI shield.

Example 10 includes an attenuation interface to reduce electromagnetic interference (EMI) of a circuit board. The interface includes a shield fence at least partially composed of metal, and an edge gasket having an EMI absorber, the edge gasket to contact the shield fence, at least one of the shield fence or the edge gasket to contact the circuit board.

Example 11 includes the interface as defined in example 10, wherein the shield fence includes a recess to receive the edge gasket.

Example 12 includes the interface as defined in any of examples 10 or 11, wherein the shield fence and the edge gasket are to extend between a chassis and the circuit board.

Example 13 includes the interface as defined in example 12, wherein the chassis includes a graphite sheet.

Example 14 includes the interface as defined in any of examples 10 to 13, wherein the edge gasket includes a dovetail-shaped cross-sectional profile to be received by a complementarily shaped recess of the shield fence.

Example 15 includes the interface as defined in any of examples 10 to 14, wherein the shield fence is integral with a side wall of an EMI shield.

Example 16 includes a method including defining or placing an outer perimeter at an attenuation interface of an electromagnetic interference (EMI) shield, the attenuation interface to be placed in contact with a circuit board, and defining or placing an inner perimeter at the attenuation interface and inward of the outer perimeter, the inner perimeter including an EMI absorber.

Example 17 includes the method as defined in example 16, further including coupling the outer and inner perimeters to a side wall of the EMI shield.

Example 18 includes the method as defined in any of examples 16 or 17, further including coupling the outer perimeter to the circuit board via a snap fit or a flange.

Example 19 includes the method as defined in any of examples 16 to 18, wherein the defining or placing the inner perimeter includes assembling a dovetail-shaped recess of the inner perimeter to a complementarily shaped recess of the outer perimeter.

Example 20 includes the method as defined in any of examples 16 to 19, further including placing an opening of the EMI shield to contact a chassis at an opposite end of the EMI shield from the circuit board.

From the foregoing, it will be appreciated that example methods, apparatus and articles of manufacture have been disclosed that enable effective EMI shielding with a relatively low cost. Examples disclosed herein can enable space savings on PCBs or other integrated circuit boards by enabling greater component and routing density, and reducing a need for EMI absorber pads or sheets. Examples disclosed herein can be greatly improve EMI isolation over known EMI absorbers (e.g., absorber pads) and known board-mounted EMI shields, which can be susceptible to openings, gaps, mechanical movement and degradation.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. While examples disclosed herein are shown in the context of shields used in conjunction with circuit boards, examples disclosed herein can be applied to any appropriate application associated with reducing emissions.

The following claims are hereby incorporated into this Detailed Description by this reference, with each claim standing on its own as a separate embodiment of the present disclosure.

What is claimed is:

1. An electromagnetic interference (EMI) shield comprising:
    side walls having respective recesses at distal ends of the side walls, the side walls having a first thickness; and
    an attenuation interface at the distal ends of the side walls, the attenuation interface including:
        an EMI absorber in the recesses; and
        a metal backing adjacent the EMI absorber, the metal backing having second thickness less than the first thickness, the EMI absorber and the metal backing to contact a circuit board.

2. The EMI shield as defined in claim 1, wherein the metal backing is a shield fence coupled to the side walls.

3. The EMI shield as defined in claim 1, wherein the EMI absorber includes a compressible elastomer with embedded metal flakes.

4. The EMI shield as defined in claim 1, wherein the EMI shield is electrically isolated from the circuit board.

5. The EMI shield as defined in claim 1, wherein the metal backing includes a flange or snap to couple to the side walls or the circuit board.

6. The EMI shield as defined in claim 1, wherein the metal backing is integral with the side walls.

7. The EMI shield as defined in claim 6, wherein the EMI absorber and the metal backing extend to a top surface of the EMI shield.

8. The EMI shield as defined in claim 7, wherein the EMI absorber and the metal backing define an opening at the top surface of the EMI shield.

9. The EMI shield as defined in claim 1, wherein the metal backing surrounds the EMI absorber.

10. The EMI shield as defined in claim 9, wherein the metal backing surrounds an entire perimeter of the EMI absorber.

11. An attenuation interface to reduce electromagnetic interference (EMI) of a circuit board, the interface comprising:
    a shield fence at least partially including metal, the shield fence having a side wall, a recess at a distal end of the side wall, a first portion of the side wall having a first thickness and the distal end of the side wall having a second thickness that is less than the first thickness; and
    an edge gasket having an EMI absorber, the edge gasket in the recess, the edge gasket to contact the shield fence, the shield fence and the edge gasket to contact the circuit board.

12. The interface as defined in claim 11, wherein the shield fence and the edge gasket are to extend between a chassis and the circuit board.

13. The interface as defined in claim 12, wherein the chassis includes a graphite sheet.

14. The interface as defined in claim 11, wherein the edge gasket includes a dovetail-shaped cross-sectional profile to be received by the recess of the shield fence.

15. The interface as defined in claim 11, wherein the shield fence is integral with the side wall.

16. A method comprising:
    defining or placing a metal backing at a distal end of a side wall of an EMI shield, the side wall having a first thickness, the metal backing a recess of the EMI shield, the metal backing having a second thickness less than the first thickness, the metal backing corresponding to a recess of the EMI shield; and
    defining or placing an EMI absorber in the recess of the EMI shield, the metal backing to surround the EMI absorber, the EMI absorber and the metal backing to be placed in contact with a circuit board.

17. The method as defined in claim 16, further including coupling the metal backing and the EMI absorber to the side wall of the EMI shield.

18. The method as defined in claim 16, further including coupling the metal backing to the circuit board via a snap fit or a flange.

19. The method as defined in claim 16, wherein the defining or placing of the EMI absorber includes assembling a dovetail-shaped recess of the EMI absorber to a complementarily shaped recess of the metal backing.

20. The method as defined in claim 16, wherein the distal end is a first distal end, and including placing an opening of the EMI shield to contact a chassis at a second distal end of the side wall of the EMI shield, the second distal end opposite from the first distal end.

* * * * *